(12) United States Patent
Chang et al.

(10) Patent No.: US 10,562,762 B2
(45) Date of Patent: Feb. 18, 2020

(54) METHOD OF FORMING SEMICONDUCTOR DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW); Chieh-Te Chen, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 118 days.

(21) Appl. No.: 15/801,308

(22) Filed: Nov. 1, 2017

(65) Prior Publication Data

US 2019/0100430 A1     Apr. 4, 2019

(30) Foreign Application Priority Data

Sep. 29, 2017   (CN) .......................... 2017 1 0911760

(51) Int. Cl.
*B81C 1/00* (2006.01)
*G03F 7/00* (2006.01)
*H01L 21/768* (2006.01)
*H01L 21/311* (2006.01)
(Continued)

(52) U.S. Cl.
CPC ...... *B81C 1/00087* (2013.01); *B81C 1/00031* (2013.01); *G03F 7/0002* (2013.01); *G03F 7/0035* (2013.01); *H01L 21/0337* (2013.01); *H01L 21/31144* (2013.01); *H01L 21/76802* (2013.01); *H01L 21/76813* (2013.01); *H01L 21/76816* (2013.01); *H01L 23/528* (2013.01); (Continued)

(58) Field of Classification Search
CPC ......... H01L 21/76816; H01L 21/31144; H01L 21/76802; H01L 21/76913; H01L 23/528; B81C 1/00031; B81C 1/00087
See application file for complete search history.

(56) References Cited

U.S. PATENT DOCUMENTS

2008/0034344 A1* 2/2008 Chiu ................... G03F 7/70633
430/5
2009/0258318 A1* 10/2009 Chan ................... H01L 21/0273
430/312
(Continued)

*Primary Examiner* — Zandra V Smith
*Assistant Examiner* — John M Parker
(74) *Attorney, Agent, or Firm* — Winston Hsu

(57) ABSTRACT

A method of forming a semiconductor device includes following steps. First of all, plural first openings and plural second openings are sequentially formed on a material layer disposed on a substrate, with the second openings across the first openings to form plural overlapped regions. Then, plural patterns arranged in an array arrangement are formed, with each pattern overlapped each overlapped region, respectively. After that, transferring the first openings, the second openings and the patterns to the material layer, to from plural material patterns in an array arrangement. In another embodiment of the present invention, the first openings and the second openings may be replaced by plural first patterns and plural second patterns, while the patterns are replaced by plural openings.

20 Claims, 13 Drawing Sheets

(51) Int. Cl.
 *H01L 23/528* (2006.01)
 *H01L 21/033* (2006.01)
(52) U.S. Cl.
 CPC  *B81C 2201/013* (2013.01); *B81C 2201/0156* (2013.01)

(56) References Cited

U.S. PATENT DOCUMENTS

2010/0112463 A1    5/2010  Yune
2018/0232478 A1*   8/2018  Golovanevsky .... G03F 7/70633

* cited by examiner

METHOD OF FORMING SEMICONDUCTOR DEVICE

BACKGROUND OF THE INVENTION

1. Field of the Invention

The present invention relates to a method of forming a semiconductor device, and more particularly to a method of forming the microstructures in a semiconductor device through a multiple photolithography and etching process.

2. Description of the Prior Art

Fabrication of microstructures requires tiny elements of precisely controlled size formed in a material layer of an appropriate substrate such as semiconductor substrate/layers, dielectric layers and/or metal layers. These tiny elements are generated by patterning the abovementioned substrate/layers, for instance, by performing photolithography and etching processes. For this purposes, in conventional semiconductor techniques, a mask layer is formed on the target, and these tiny elements are defined in the mask layer and followed by being transferred to the target layer. Generally, the mask layer may include or is formed by means of a layer of photoresist that is patterned by lithographic process and/or patterned hard mask including the patterns transferred from the patterned photoresist.

As feature sizes are decreased by the complexity of currently integrated circuits, the existing single patterning process has met its bottleneck to successfully render the features. That is, the overlay accuracy and the resolution among this feature have to push the lithographic limit further to create even smaller, more densely packed devices. Therefore, it is still urgent to those of skilled in the art to develop or improve the conventional scheme for these tiny elements.

SUMMARY OF THE INVENTION

It is one of the primary objectives of the present invention to provide a method of forming a semiconductor device. Instead of using a sidewall image transfer (SIT) technique, a multiple photolithography and etching is performed in the present forming method to respectively form opening patterns or patterns which are crosses or overlapped with each other, so as to achieve the formation of micro-patterns. That is, the forming method of the present invention is able to form a smaller, more densely packed layout or semiconductor under a cost-saving and simplified process flow.

To achieve the purpose described above, the present invention provides a method of forming a semiconductor device including the following steps. First of all, a material layer is formed on a substrate, and a first photoresist layer is then formed on the material layer through a first photomask, with the first photoresist layer including a plurality of first openings paralleled arranged along a first direction. Next, a second photoresist layer is formed on the material layer through a second photomask, with the second photoresist layer including a plurality of second openings paralleled arranged along a second direction, and the second openings of the second photoresist layer being across the first openings of the first photoresist layer to form a plurality of overlapped regions. Then, a third photoresist layer is formed on the material layer through a third photomask, with the third photoresist layer including a plurality of first patterns arranged in an array arrangement, and each of the first patterns overlapped each of the overlapped regions. Finally, the first openings of the first photoresist layer, the second openings of the second photoresist layer and the first patterns of the third photoresist layer are transferred to the material layer to from a plurality of material patterns in an array arrangement.

To achieve the purpose described above, the present invention provides a method of forming a semiconductor device including the following steps. First of all, a material layer is formed on a substrate, and a first photoresist layer is then formed on the material layer through a first photomask, with the first photoresist layer including a plurality of first patterns paralleled arranged along a first direction. Next, a second photoresist layer is formed on the material layer through a second photomask, with the second photoresist layer including a plurality of second patterns paralleled arranged along a second direction, and the second patterns of the second photoresist layer across the first patterns of the first photoresist layer to form a plurality of overlapped. Then, a third photoresist layer is formed on the material layer through a third photomask, with the third photoresist layer including a plurality of openings arranged in an array arrangement, and each of the openings overlapped each of the overlapped regions. Finally, the first patterns of the first photoresist layer, the second patterns of the second photoresist layer and the openings of the third photoresist layer are transferred to the material layer, to from a plurality material patterns in an array arrangement.

Overall, the method of the present invention includes sequentially forming virtuous photoresist structures on a material layer such as a hard mask layer and/or a target layer, with each of the photoresist structures defining openings extended along different directions and blocking patterns overlapped with those openings, respectively. Since the formed openings cross with each other, and the crossed portion (namely, the overlapped portion) thereof further overlap with the blocking patterns, the corresponding patterns of the blocking patterns may be further patterned by the corresponding openings of these openings, during transferring those openings and the blocking patterns to the material layer. In this way, plural patterns, such as the hard mask pattern and or the material patterns, with smaller pitch and dimension related to the blocking patterns are therefore formed in the material layer. Thus, the forming method of the present invention is able to be used in general semiconductor process to forma smaller, more densely packed layout or semiconductor structure. Furthermore, the forming method may also perform a double patterning process, to form other openings which are alternately and parallel arranged in another region, during forming those openings, so as to reduce the number of the photomask used in the forming process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 15 are schematic diagrams illustrating a method of forming a semiconductor device according to a first embodiment of the present invention, in which:

FIG. 1 shows a top view of a semiconductor device after forming a first photoresist structure;

FIG. 2 shows a cross-sectional view of a semiconductor device after forming the first photoresist structure;

FIG. 3 shows a top view of a semiconductor device after performing a first etching process;

FIG. 4 shows a top view of a semiconductor device after forming a second photoresist structure;

FIG. 5 shows a cross-sectional view of a semiconductor device after forming the second photoresist structure;

FIG. 6 shows a top view of a semiconductor device after performing a second etching process;

FIG. 7 shows a cross-sectional view of a semiconductor device after performing a second etching process;

FIG. 8 shows a top view of a semiconductor device after forming a third photoresist structure;

FIG. 9 shows a cross-sectional view of a semiconductor device after forming the third photoresist structure;

FIG. 10 shows a top view of a semiconductor device after performing a third etching process;

FIG. 11 shows a cross-sectional view of a semiconductor device after performing a third etching process;

FIG. 12 shows a cross-sectional view of a semiconductor device after performing a fourth etching process;

FIG. 13 shows a cross-sectional view of a semiconductor device after performing a fifth etching process;

FIG. 14 shows a top view of a semiconductor device after performing a pattern transferring process;

FIG. 15 shows a cross-sectional view of a semiconductor device after performing a pattern transferring process.

FIG. 19 to FIG. 20 are schematic diagrams illustrating a method of forming a semiconductor device according to a third embodiment of the present invention, in which:

FIG. 19 shows a semiconductor device after forming photo masks;

FIG. 20 shows a semiconductor device after performing a pattern transferring process.

DETAILED DESCRIPTION

To provide a better understanding of the presented invention, preferred embodiments will be described in detail. The preferred embodiments of the present invention are illustrated in the accompanying drawings with numbered elements.

Please refer to FIG. 1 to FIG. 15, which are schematic diagrams illustrating a forming process of a semiconductor device according to the first embodiment of the present invention, wherein FIGS. 1, 4, 6, 8, 10 and 14 respectively show a top view of the semiconductor device during the forming process, and other figures respectively show a cross-sectional view of the semiconductor device during the forming process, with FIGS. 2, 5, 7, 9, 11 and 15 being a cross-sectional view along cross lines A-A' and B-B' in FIGS. 1, 4, 6, 8, 10, and 14.

Figure 2:
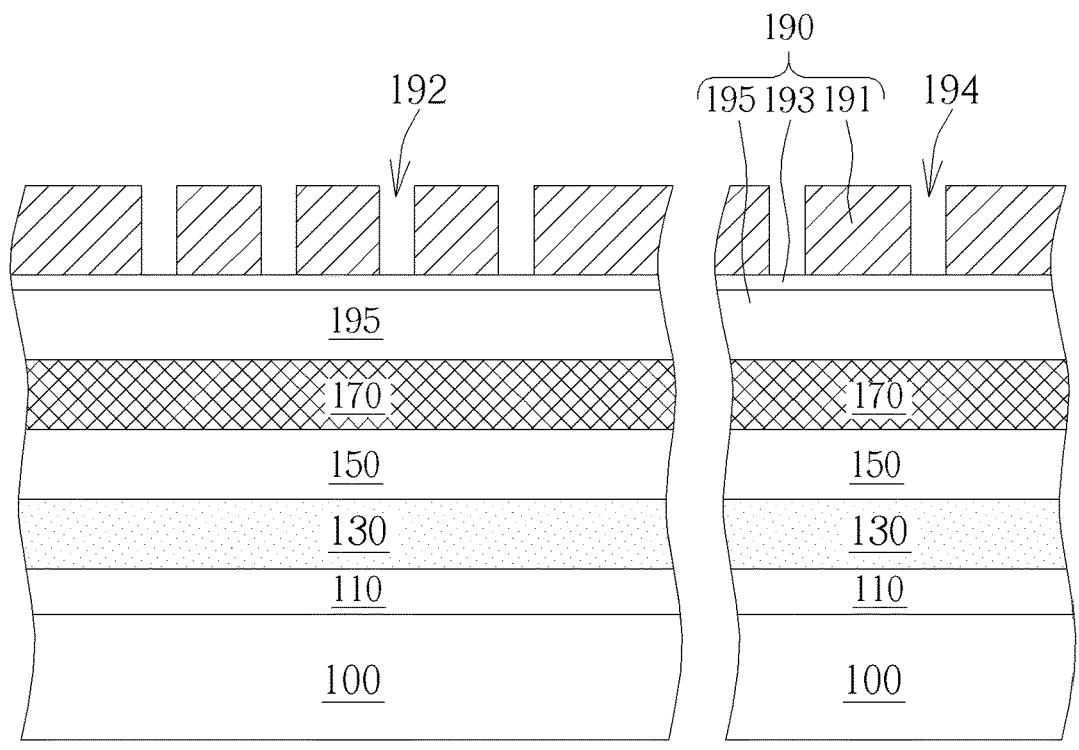

Firstly, a substrate layer 100 is provided, and the substrate layer 100 for example includes a semiconductor substrate (not shown in the drawings) like a silicon substrate, a silicon containing substrate or a silicon-on-insulator (SOI) substrate, and/or a dielectric layer (not shown in the drawings), such as including silicon oxide ($SiO_x$), silicon nitride (SiN) or silicon oxynitride (SiON), but is not limited thereto. The substrate layer 100 has a first region 100a and a second region 100b, and a target layer 110 and a hard mask layer 130 are sequentially formed on the substrate layer 100, covering both the first region 100a and the second region 100b, as shown in FIG. 2. In the present embodiment, the target layer 110 may include a preferably material like a semiconductor material, a dielectric material or a conductive material, and the hard mask layer 130 for example includes a monolayer structure having SiN or silicon carbonitride (SiCN). In another embodiment, the hard mask layer may also include a multilayer structure having a first hard mask layer (such as including SiN, not shown in the drawings) and a second hard mask layer (such as including titanium nitride, not shown in the drawings) stacked on the first hard mask layer.

Figure 1:
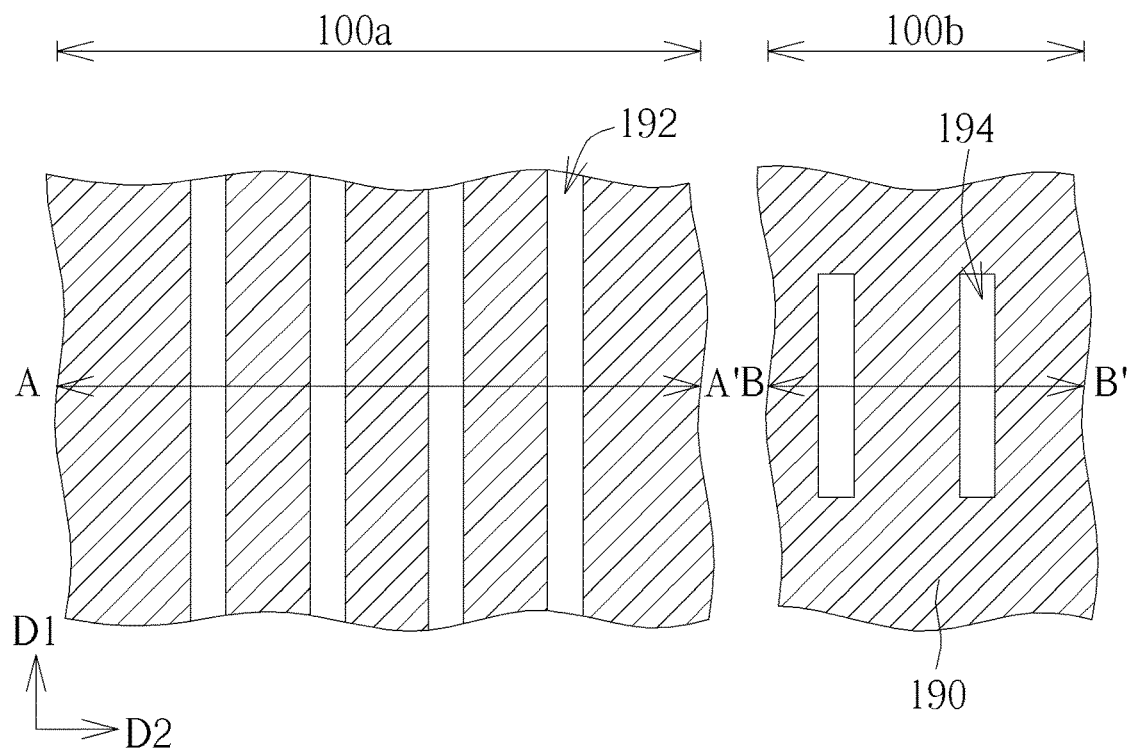

Next, a first mask layer 150, a second mask layer 170 and a photoresist structure 190 are sequentially formed on the hard mask layer 130, the first mask layer 150 and the second mask layer 170 preferable include materials having a great etching selectivity related to the hard mask layer 130 underneath, and the materials of the first mask layer 150 and the second mask layer 170 also preferable include a great etching selectivity therebetween. For example, the first mask layer 150 includes polysilicon, and the second mask layer 170 includes $SiO_x$, but not limited thereto. In the present embodiment, the photoresist structure 190 includes a multilayer structure for example having a sacrificial layer 195, an anti-reflection layer 193 such as a silicon-containing hard mask bottom anti-reflection coating (SHB) layer, and a patterned photoresist layer 191 stacked one over another. The patterned photoresist layer 191 further defines a plurality of openings 192, 194 within the first region 100a and the second region 100b, and each of the openings 192, 194 are paralleled extended along a first direction D1, as shown in FIGS. 1 and 2.

Figure 3:
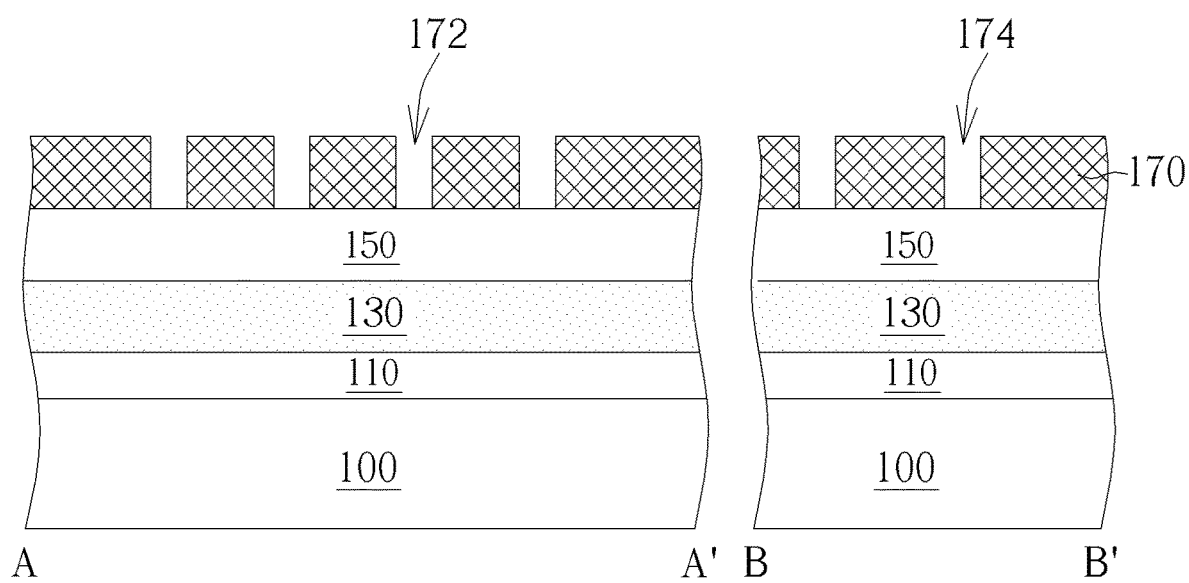

As shown in FIG. 3, an etching process is performed, to simultaneously transfer the openings 192, 194 of the patterned photoresist layer 191 to the second mask layer 170, and to form corresponding openings 172, 174 within the first region 100a and the second region 100b. The openings 172, 174 within the first region 100a and the second region 100b are paralleled extended along the first direction D1, to expose a portion of a top surface of the first mask layer 150. Then, the photoresist structure 190 is completely removed.

Figure 4:
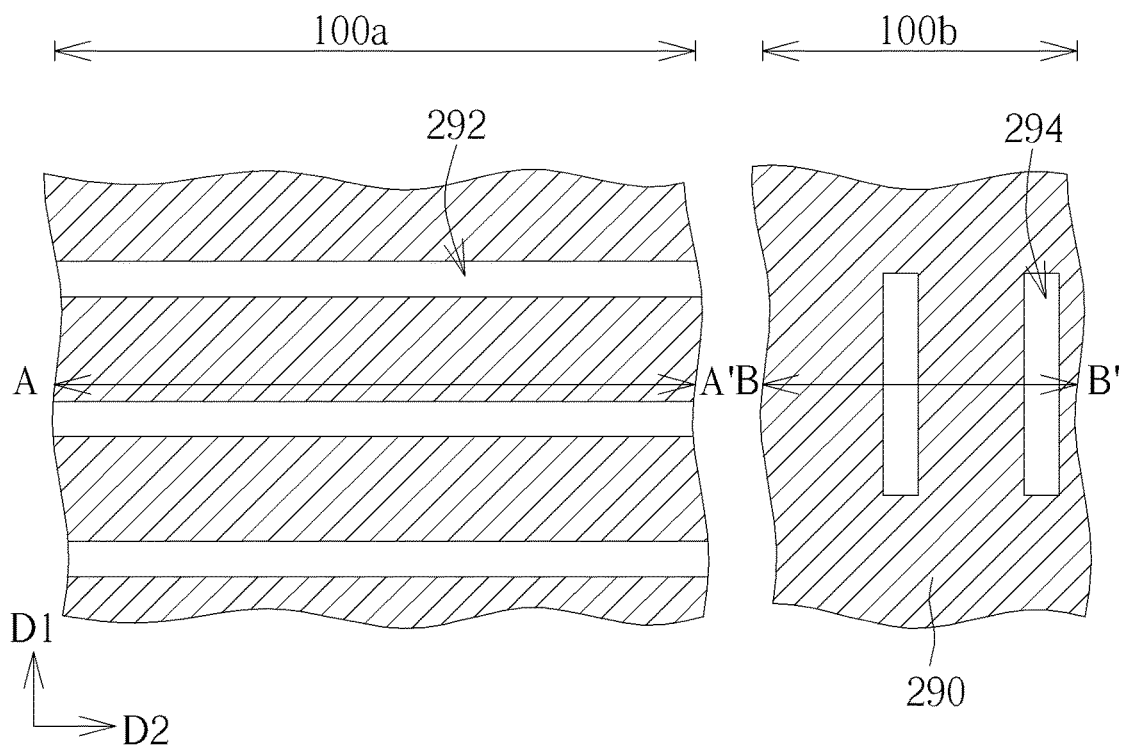
Figure 5:
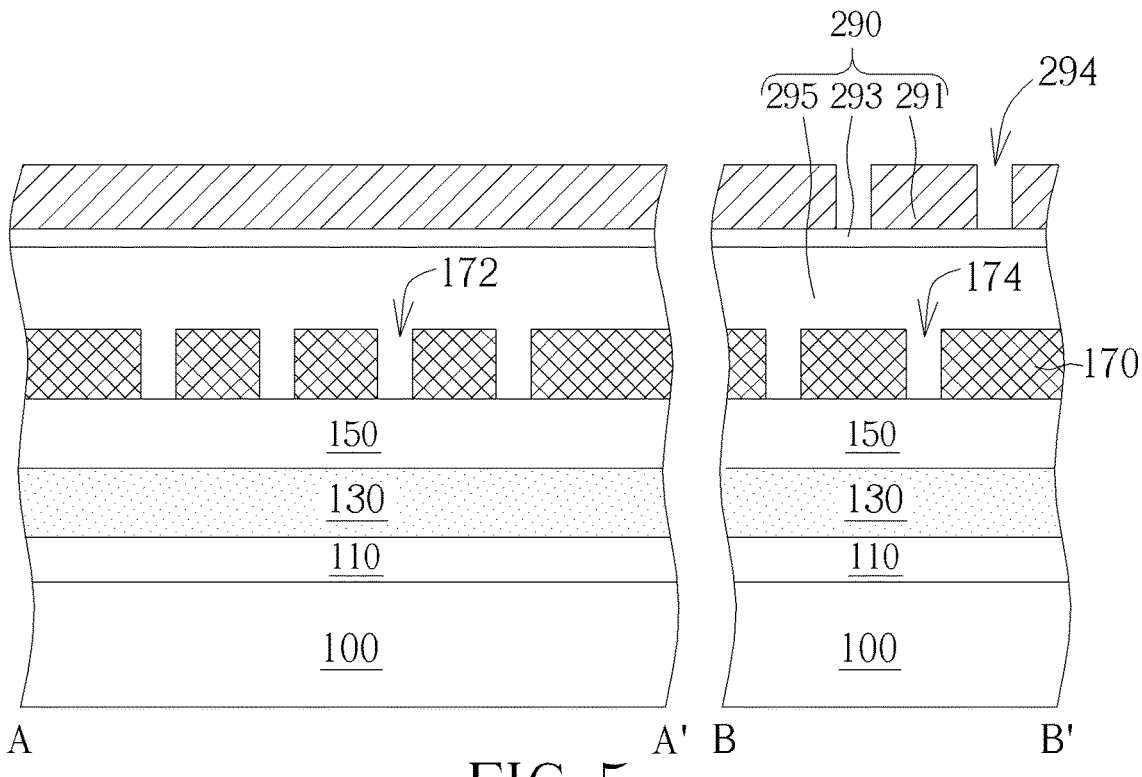

Then, another photoresist structure 290 is formed and which also includes a multilayer structure having a sacrificial layer 295, an anti-reflection layer 293 such as a SHB layer, and a patterned photoresist layer 291 stacked one over another. In the present embodiment, the planar sacrificial layer 295 entirely covered the second mask layer 170 and further filled in the openings 172, 174 within the first region 100a and the second region 100b, and the anti-reflection layer 293 and the patterned photoresist layer 291 are then formed sequentially on the sacrificial layer 295, as shown in FIG. 5. It is noted that, the patterned photoresist layer 291 further defines a plurality of openings 292, 294 in the first region 100a and the second region 100b within the first region 100a and the second region 100b, each of the openings 292 are paralleled extended along a second direction D2 different from the first direction D1, to cross the openings 172 underneath, and each other openings 294 are paralleled extended along the first direction D1, to alternately arrange with the openings 174 underneath, as shown in FIGS. 4 and 5. In the present embodiment, the second direction D2 is preferably perpendicular to the first direction D1, but not limited thereto. In another embodiment, the second direction may also be optionally not perpendicular to the first direction, with the second direction only across the first direction.

Figure 6:
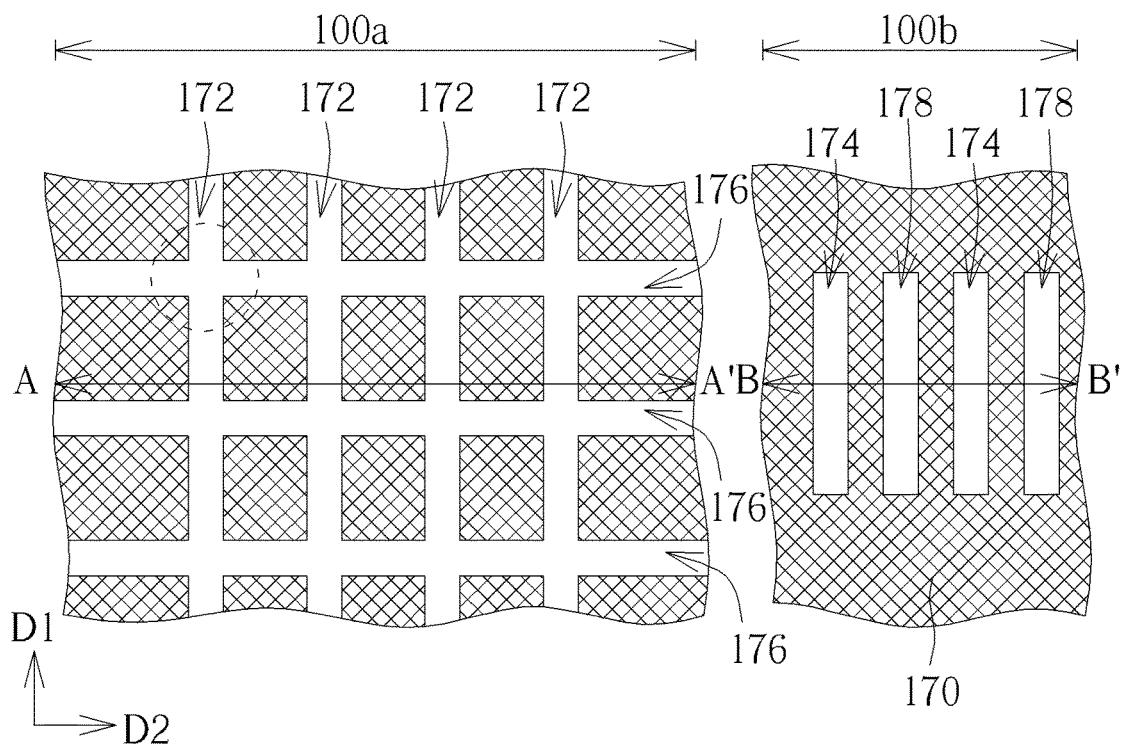
Figure 7:
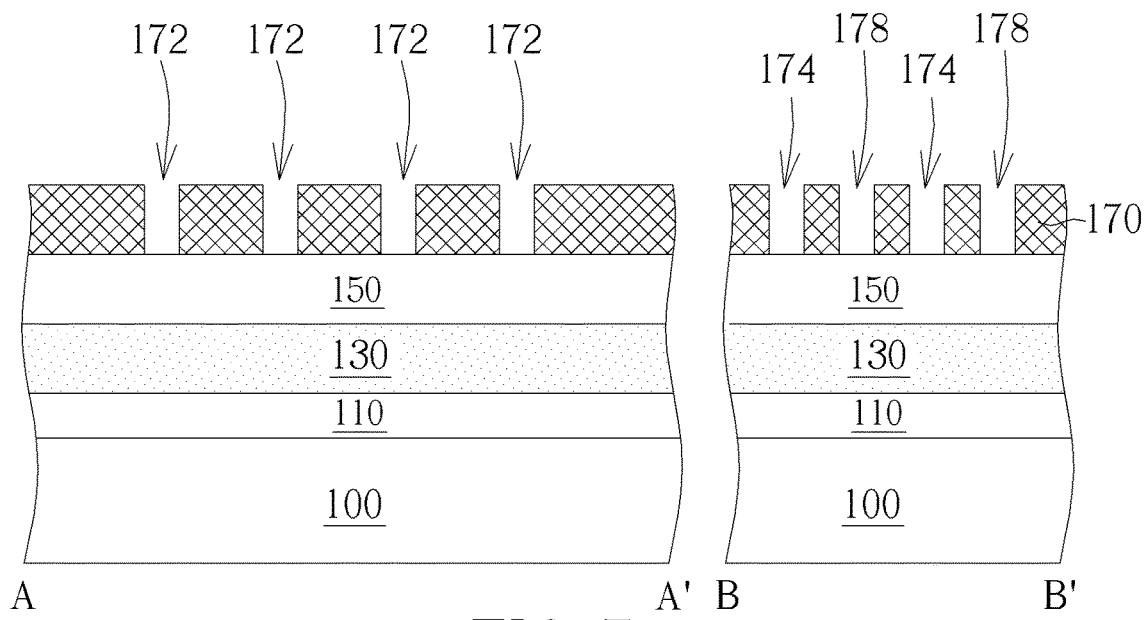

As shown in FIGS. 6 and 7, another etching process is performed, to simultaneously transfer the openings 292, 294 of the patterned photoresist layer 291 to the second mask layer 170, and to form corresponding openings 176, 178 within the first region 100a and the second region 100b. Then, the photoresist structure 290 is completely removed. The openings 176 are paralleled extended along the second direction D2, across the openings 172, to expose another portion of the top surface of the first mask layer 150. In the present embodiment, since the second direction D1 is perpendicular to the first direction D1, each of the openings 172, 176 which are across with each other are therefore formed an overlapped region, for example a cross-type overlapped region as shown in the virtual box in FIG. 6. In the present embodiment, each of the cross-type overlapped regions includes each overlapped portion between the openings 172, 176, and another portions of the opening 172 and the opening 176, but not limited thereto. On the other hand, the openings 174, 178 formed in the second regions 100b are all extended along the first direction D1, and which are alternately arranged and not cross with each other, as shown in FIG. 6.

Figure 8:
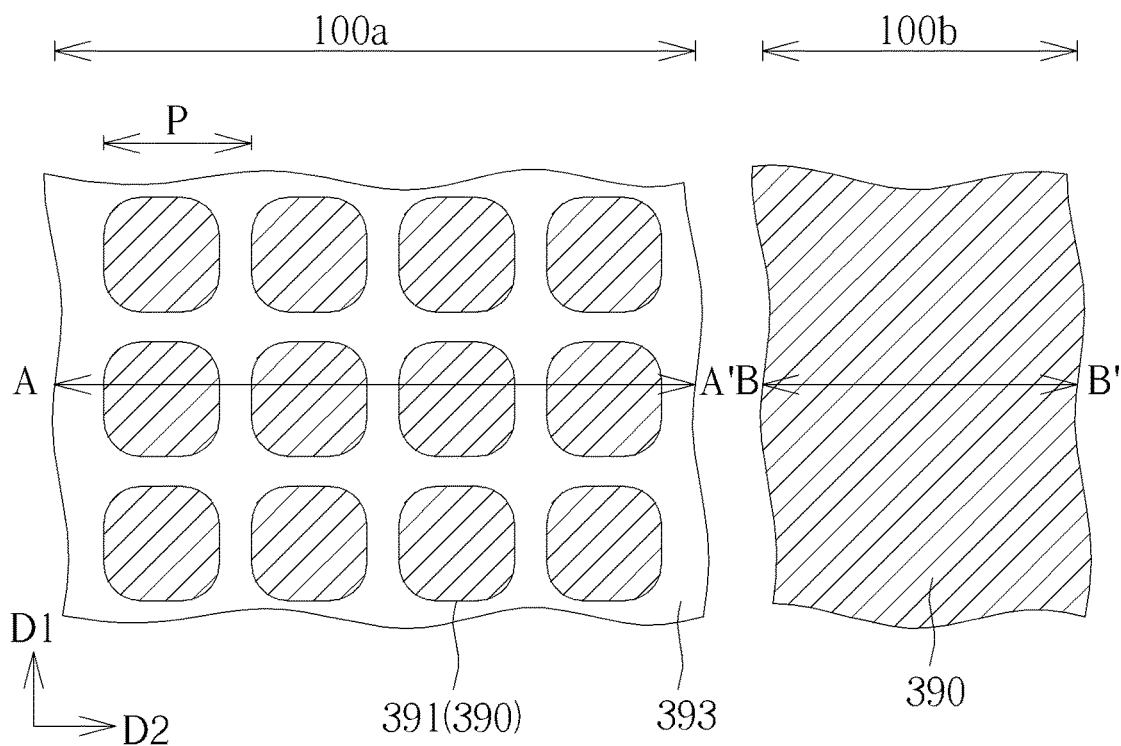
Figure 9:
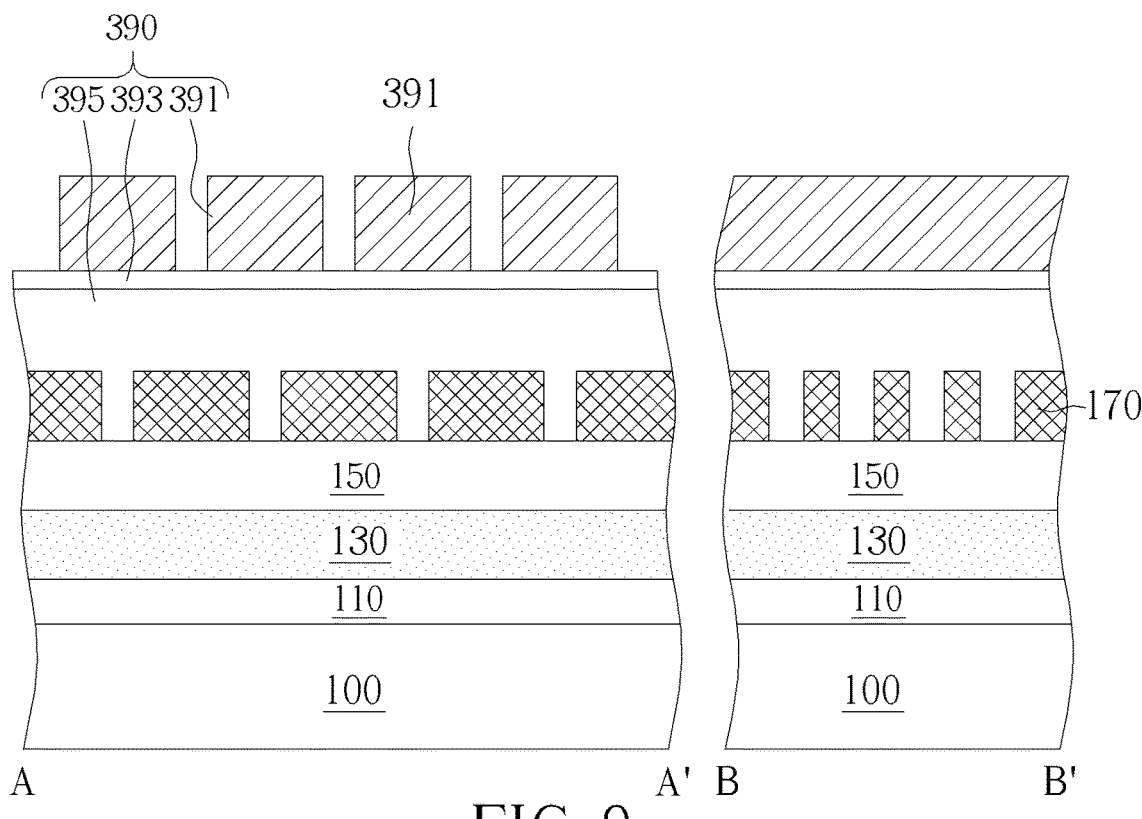

Following these, another photoresist structure 390 is formed and which also includes a multilayer structure having a sacrificial layer 395, an anti-reflection layer 393 such as a SHB layer, and a patterned photoresist layer 391 stacked one over another. In the present embodiment, the planar sacrificial layer 395 entirely covered the second mask layer 170 and further filled in the openings 172, 174, 176, 178 within the first region 100a and the second region 100b, and the anti-reflection layer 393 and the patterned photoresist layer 391 are then formed sequentially on the sacrificial layer 395, as shown in FIG. 9. It is noted that, the patterned photoresist layer 391 covers the entire second region 100b, and further defines a plurality of blocking patterns in the first region 100a, with each of the blocking patterns having the same regular shape such as a rectangular-shape (as shown in FIG. 8), a diamond-shape or circular-shape, and arranged in an array arrangement, as shown in FIG. 8. In the present embodiment, each of the blocking patterns are spaced from one another in the same pitch P, and which is partially overlapped with the openings 172, 176 underneath, especially overlapping with each of the overlapped regions underneath.

Figure 10:
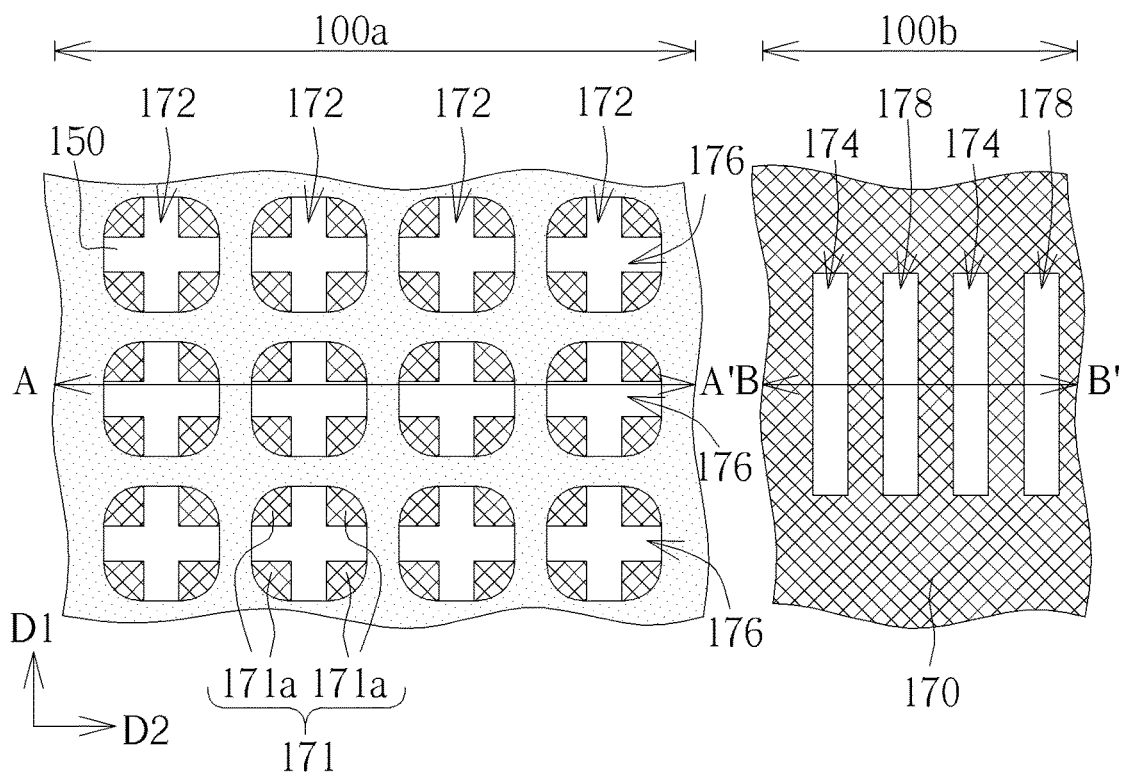
Figure 11:
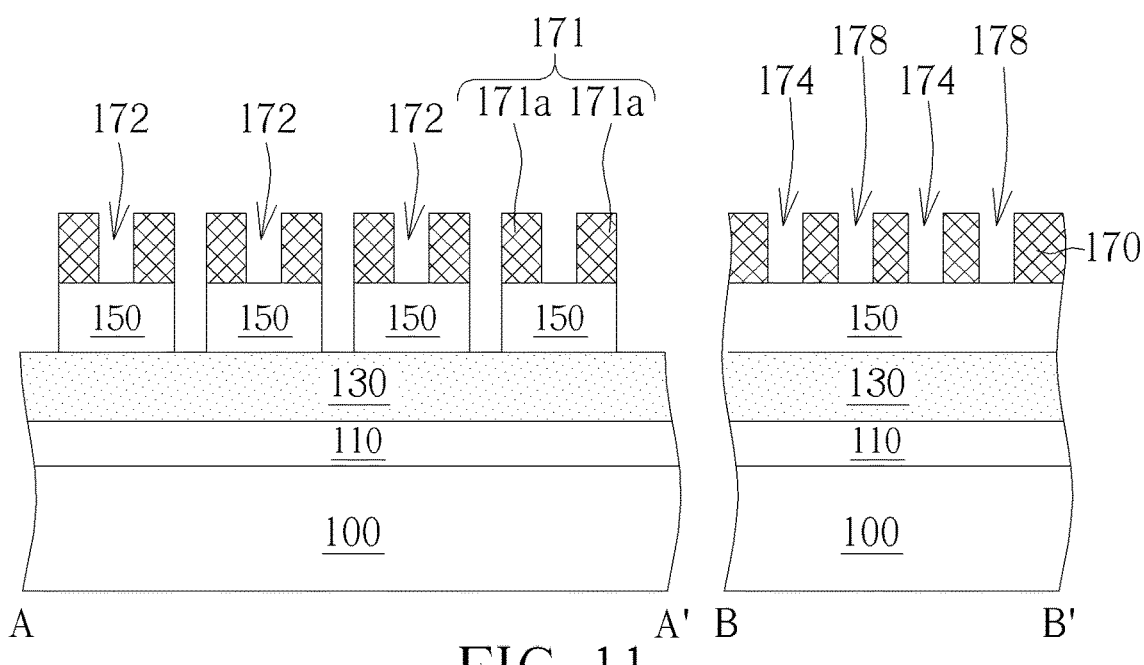

As shown in FIGS. 10 and 11, another etching process is performed to simultaneously transfer the blocking patterns of the patterned photoresist layer 391 to the second mask layer 170 and the first mask layer 150, and to form a plurality of entity patterns 171 within the first region 100a. Then, the photoresist structure 390 is completely removed. Precisely, each of the entity patterns 171 are disposed protrudingly from the hard mask layer 130, and have corresponding shape of the blocking patterns, such as the rectangular-shape (as shown in FIG. 10), the diamond-shape or the circular-shape. Meanwhile, since each of the blocking patterns are overlapped with the overlapped regions underneath, each of the entity patterns 171 are also overlapped with thereto. That is, a cross-type trench is therefore formed in each of the entity patterns 171, as shown in FIGS. 10 and 11. In this way, the entity patterns 171 may further be divided into four parts 171a by the cross-type trench. On the other hand, while performing the aforementioned etching process, the second region 100b is entirely covered by the pattern photoresist layer 391, so that, the second mask layer 170 and the openings 174, 178 formed therein are not further etched, as shown in FIGS. 10 and 11.

Figure 12:
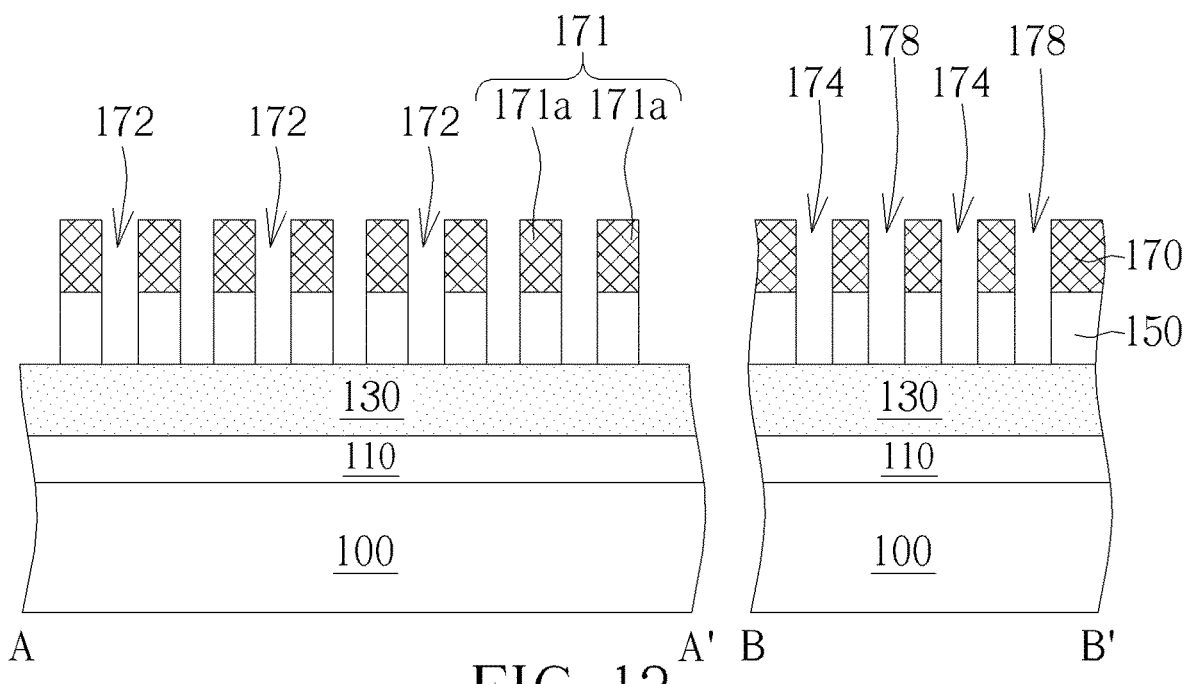

As shown in FIG. 12, another etching process is continuously performed, by using the second mask layer 170 as an etching mask, and using the hard mask layer 103 as an etching stop layer. In the present etching process, the openings 172, 174, 176, 178 within the second mask layer 170 are further transferred into the first mask layer 150, to expose a portion of the hard mask layer 130 from the openings 172, 174, 176, 178. Then, the second mask layer 170 is completely removed.

Figure 13:
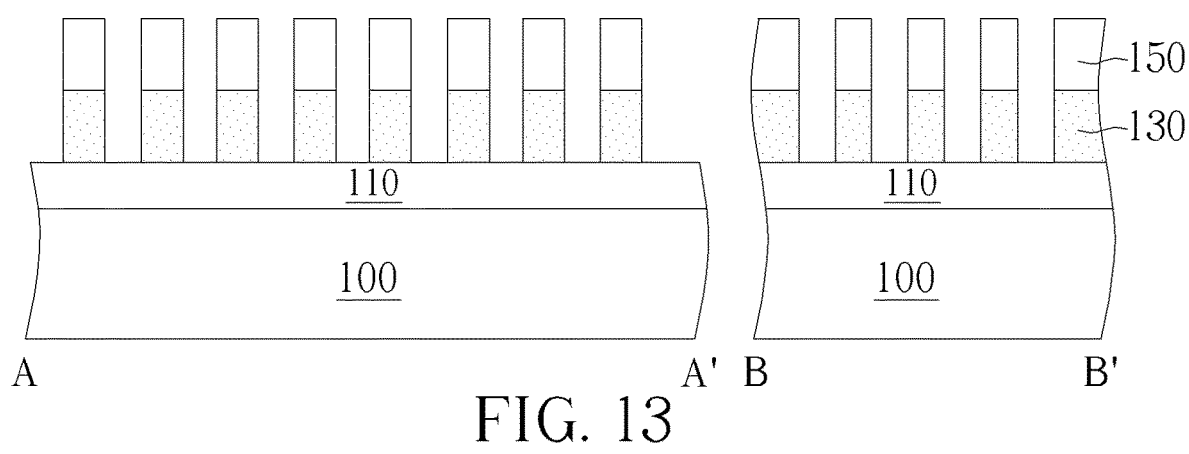
Figure 14:
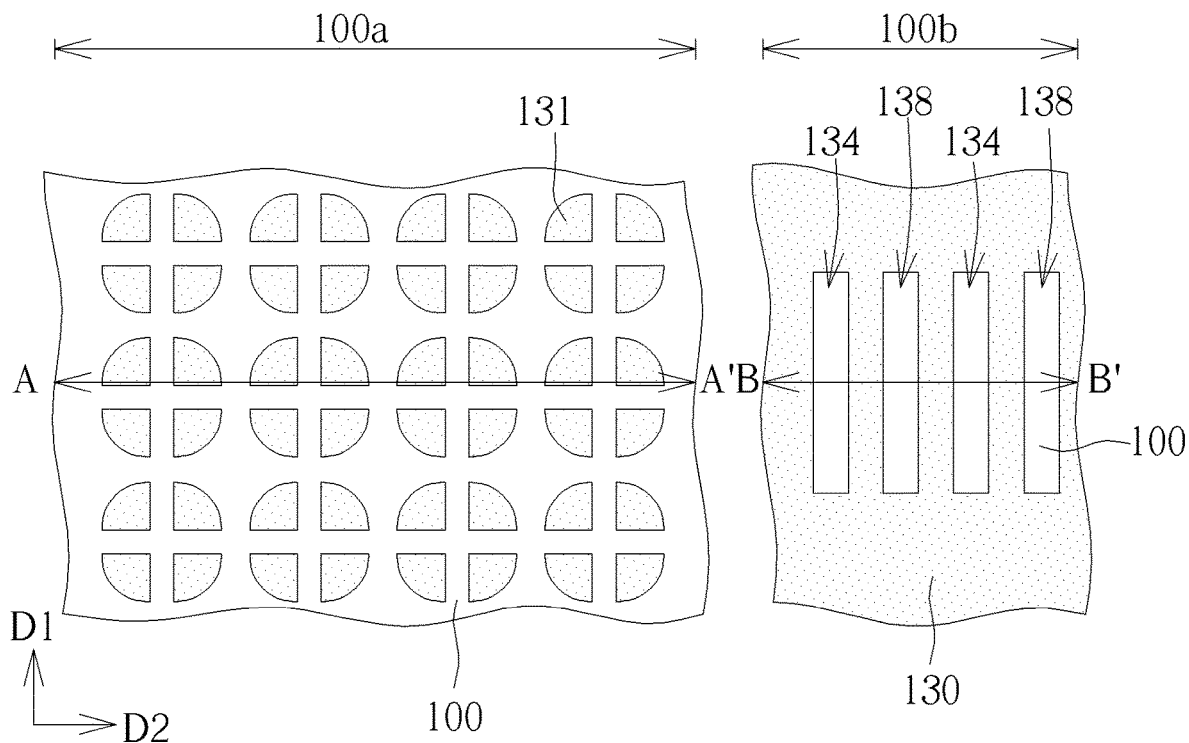
Figure 15:
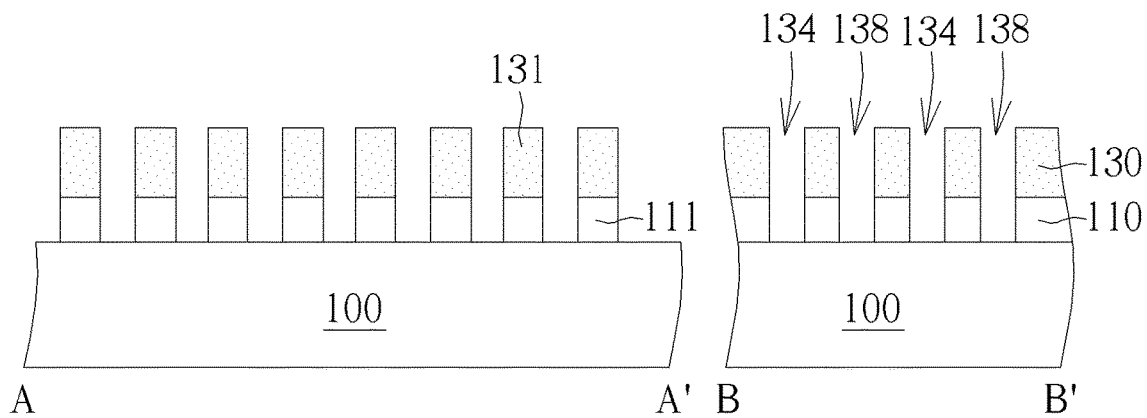

After that, at least one etching process is performed, to simultaneously transfer the openings 172, 174, 176, 178 and the entity patterns 171 into the hard mask layer 130 and the target layer 110. In the present embodiment, a two-stepped etching process is performed, with a first etching process being performed by using the first mask layer 150 as an etching mask, to etch the hard mask layer 130, as shown in FIG. 13, and with the second etching process being performed after removing the first mask layer 150, by using the etched hard mask layer 130 as an etching mask, to etch the target layer 110, as shown in FIGS. 14 and 15. In this way, openings 134, 138 corresponding to the openings 174, 178 are formed in the hard mask layer 130 and the target layer 110, within the second region 100b, to expose a portion of the top surfaces of the substrate layer 100. Also, a plurality of mask patterns 131 and/or a plurality of material patterns 111 corresponding to the entity patterns are formed in the hard mask layer 130 and the target layer 110, to expose a portion of the top surfaces of the substrate layer 100.

Precisely, each of the mask patterns 131 and/or the material patterns 111 is disposed protrudingly from the substrate layer 110, and which includes a smaller dimension and pitch related to the entity patterns 171. For example, each of the mask patterns 131 and/or the material patterns 111 is about a quarter of each entity pattern 171, but not limited thereto. Furthermore, the mask patterns 131 and/or the material patterns 111 are also in an array arrangement, through a top view as shown in FIG. 14.

Figure 16:
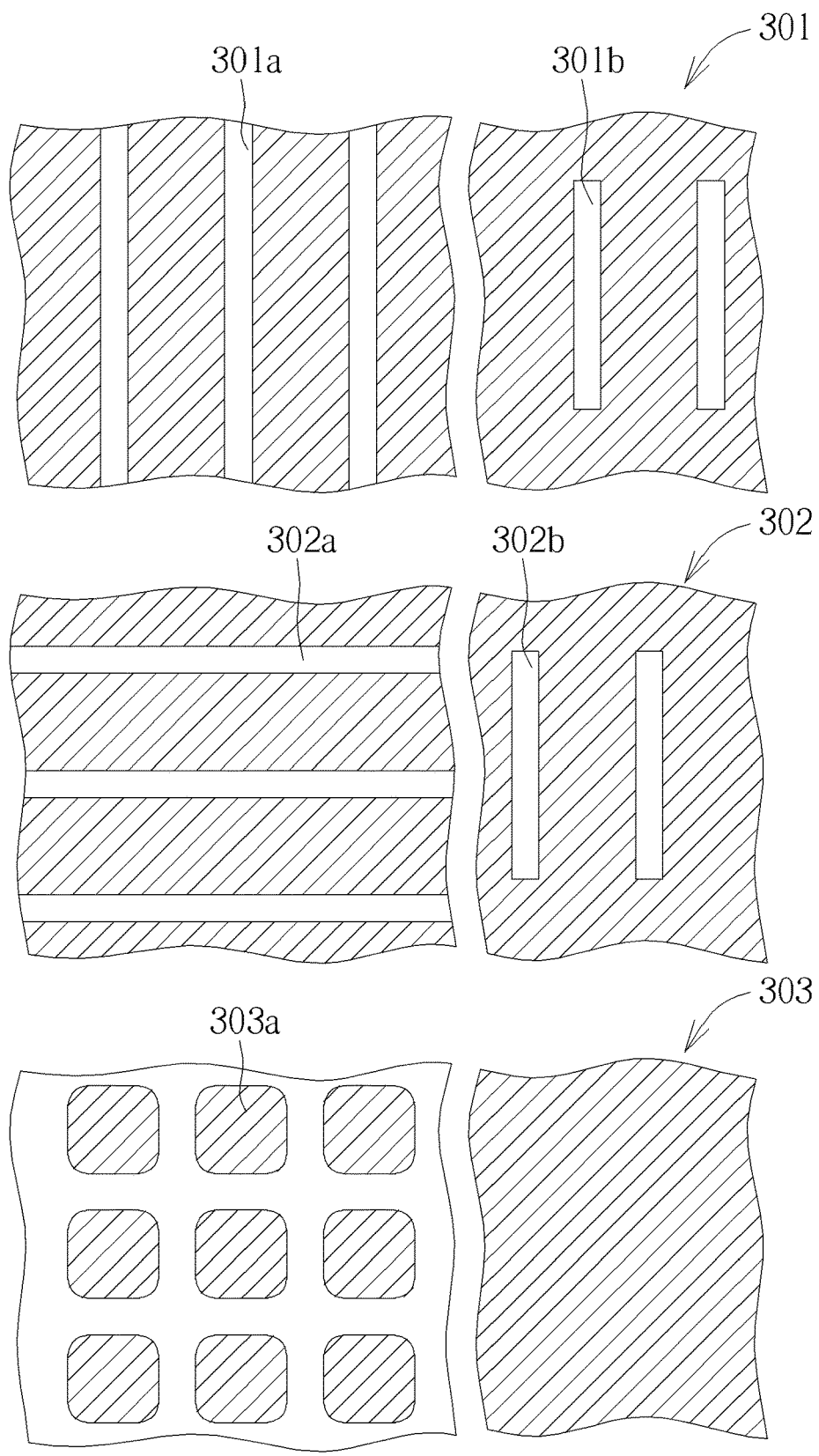
FIG. 16 is a schematic diagram illustrating photomasks used in a method of forming a semiconductor device according to the first embodiment of the present invention.

Through the aforementioned steps, the forming method of the first preferred embodiment in the present invention is accomplished. In the present embodiment, the forming method is mainly achieved by using three photomask 301, 302, 303 as shown in FIG. 16, with the photomask 301 defining a plurality of opening patterns 301a extended along a same direction, within a region, with the photomask 302 defining a plurality of opening patterns 302a extended along another direction, within the region, and with the photomask 303 defining a plurality of entity patterns 303a in an array arrangement, within the region. Accordingly to those three photomask 301, 302, 303, various photoresist structures 190, 290, 390 are sequentially formed on the hard mask layer 130 and/or the target layer 110, to form corresponding mask patterns 131 and/or target patterns 111. It is noted that, the opening patterns 301a of the photomask 301 and the opening patterns 302a of the photomask 302 are partially overlapped with each other, and the overlapped portion therebetween may therefore form the cross-type overlapped regions. Also, the entity patterns 303a of the photomask 303 are overlapped with the cross-type overlapped regions, respectively, so that, the openings 192, 292 and the blocking patterns formed according to the photomasks 301, 302, 303 are overlapped with each other either. With this arrangement, while simultaneously transferring the openings 192, 292 and the blocking patterns 391 to the hard mask layer 130 and/or the target layer 110, the formed patterns corresponding to the blocking patterns are further patterned by the formed openings corresponding to the openings 192, 292. That is, the mask patterns 131 and/or the target patterns 111 with smaller dimension and pitch related to the blocking patterns are therefore formed in the hard mask layer 130 and/or the target layer 110.

Thus, according to the forming method of the present embodiment, instead of using complex sidewall image transfer technique, a multiple photolithography and etching is performed, to form a smaller, more densely packed layout or semiconductor under a cost-saving and simplified process flow. Moreover, the forming method of the present embodiment may also use the photomask 301, 302 to define the opening patterns 301*b*, 302*b* extended along the same direction, within another region, so that, the openings 194, 294 parallel and alternately extended along the same direction are formed through a double patterning process in the another region, during the openings 192, 292 are formed. That is, the number of the photomask used in the present invention can be sufficient reduced.

Figure 17:
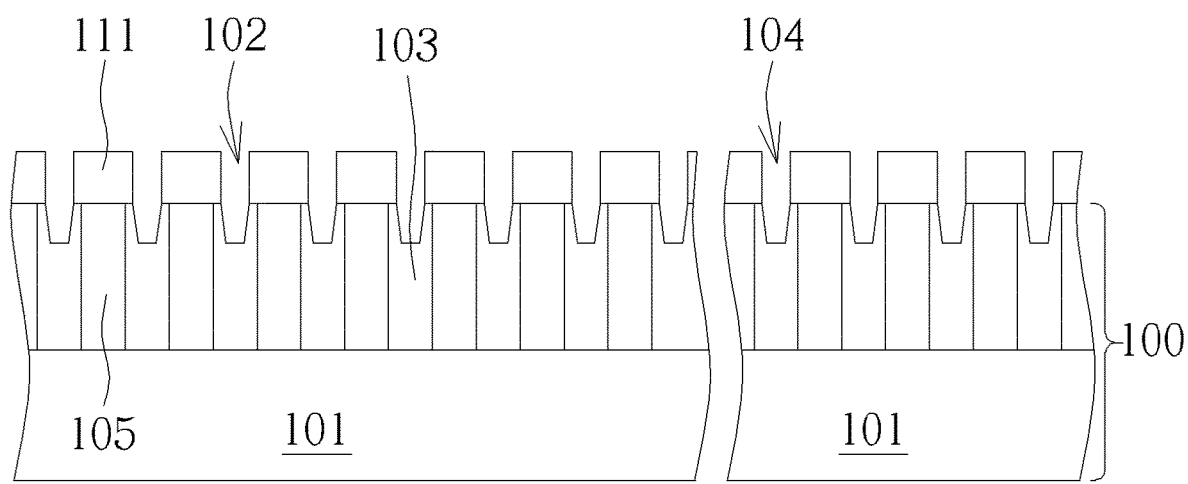
FIG. 17 is a schematic diagram illustrating a top view of a semiconductor device according to the first embodiment of the present invention.

The method of the present invention may be practical applied on a semiconductor process, for example a process of a semiconductor memory device like a dynamic random access memory (DRAM) device, to form the contact pads electrically connected to each storage node contact (SNC). For example, in one embodiment, the substrate layer 100 may include a semiconductor substrate 101 such as a silicon substrate, and a dielectric layer 103 such as including silicon nitride, disposed on the semiconductor substrate 101, wherein, the first region 100*a* of the substrate layer 100 is configured as a cell region, and the second region 100*b* of the substrate layer 100 is configured as a periphery region. Also, a buried transistor (not shown in the drawings) may be formed in the semiconductor substrate 101 to function like a word line (WL), and a plurality of bit lines (BLs, not shown in the drawings) and a plurality of plugs 105 are formed in the dielectric layer 103 on the semiconductor substrate 101, as shown in FIG. 17.

The target layer 110 of the present embodiment for example includes a conductive layer including a low-resistant metal material like tungsten (W), alumina (Al) or copper (Cu). With such arrangement, when performing the present method by simultaneously transferring the openings 192, 194, the openings 292, 294, and the blocking patterns into the target layer 110 (namely the conductive layer), the target layer 110 may therefore be patterned into conductive patterns 111, and the openings 102, 104 are also formed in the cell region 100*a* and the periphery region 100*b*, as shown in FIG. 17. It is noted that, each conductive patterns 111 may directly in contact with the plugs 105 to function like a storage node pad (SN pad), so that, each plugs 105 may be further electrically connected to a source/drain region (not shown in the drawings) of the transistor via a silicide layer (not shown in the drawings), to function like a SNC. However, the present forming method is not limited to be applied to the semiconductor memory process above, and in another embodiment, the method may also be applied to other semiconductor processes for forming smaller, more densely packed layout or semiconductor under a cost-saving and simplified process flow.

People skilled in the arts may fully understand that the method of the present invention is not limited to be achieved through the aforementioned process, and also include other process. For example, in some embodiments of the present invention, the hard mask layer 130 may be omitted, and the openings and the blocking patterns defined by the photoresist structures are directly formed on the target layer 110. Otherwise, the forming order of the photomasks are changed, so that, the blocking patterns are firstly formed, followed by forming those openings. The following description will detail the different embodiments of the method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 18:
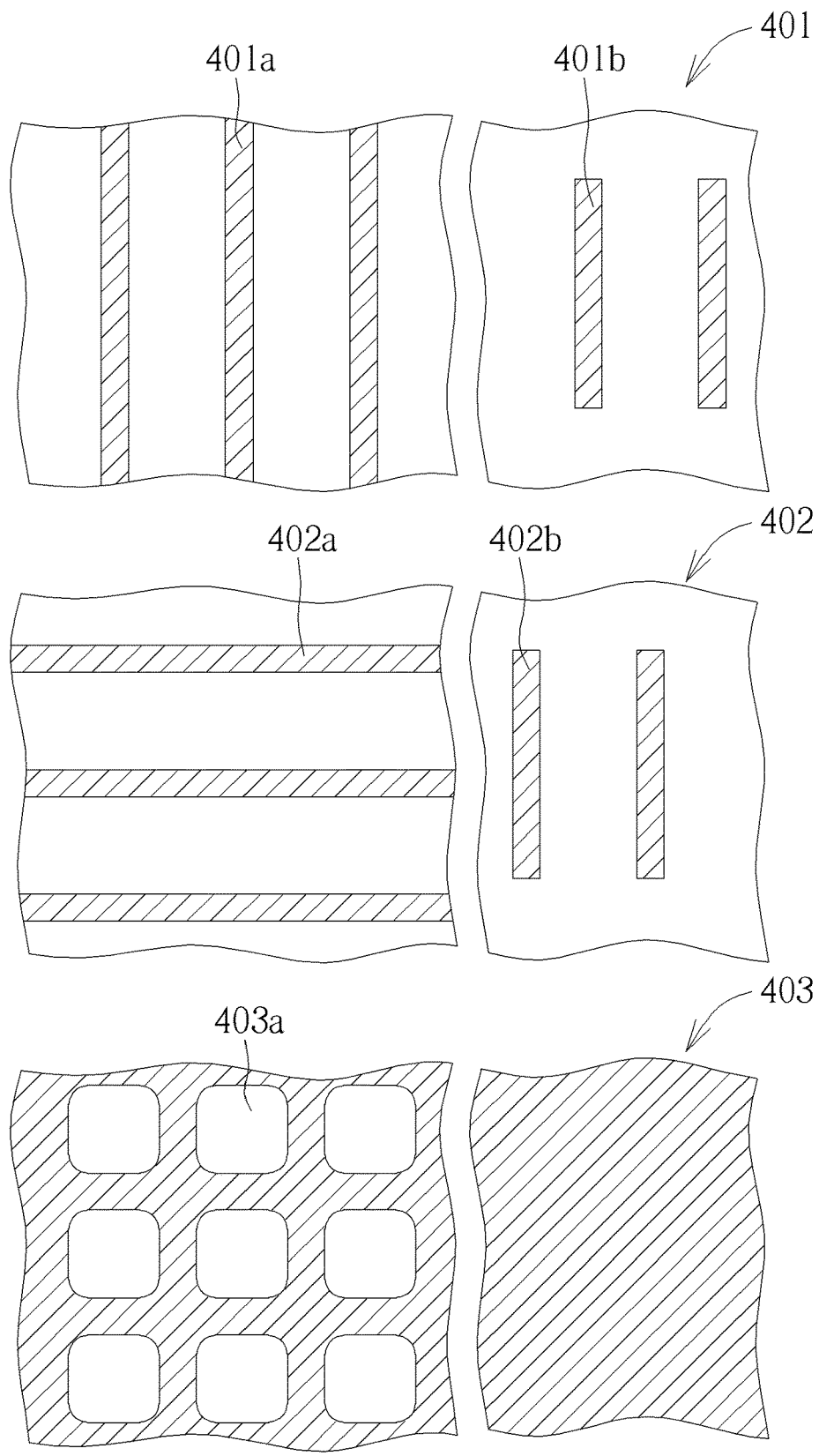
FIG. 18 is a schematic diagram illustrating a method of forming a semiconductor device according to a second embodiment of the present invention.

As shown in FIG. 18, a schematic diagram is shown to illustrate a forming process of a semiconductor device according to the second embodiment of the present invention. The formal steps in the present embodiment are similar to those in the first embodiment, and which will not redundantly described herein. The differences between the present embodiment and the aforementioned first embodiment are that, the forming method of the present embodiment is achieved by using three photomask 401, 402, 403 as shown in FIG. 18, with the photomask 401 defining a plurality of entity patterns 401*a* extended along a same direction, within a region, with the photomask 402 defining a plurality of entity patterns 402*a* extended along another direction, within the region, and with the photomask 403 defining a plurality of opening patterns 403*a* in an array arrangement, within the region. Accordingly to those three photomask 401, 402, 403, corresponding blocking patterns and openings are respectively formed in various photoresist structures sequentially formed on the hard mask layer 130 and/or the target layer 110 via a negative resist. Thus, while simultaneously transferring the corresponding blocking patterns and openings to the hard mask layer 130 and/or the target layer 110 underneath, mask patterns (not shown in the drawings) and/or the target patterns (not shown in the drawings) with relative smaller dimension and pitch are therefore formed in the hard mask layer 130 and/or the target layer 110, in similar layout as shown in FIG. 14 of the aforementioned first embodiment. Also, the photomasks 401, 402, 403 of the present embodiment are not limited to be form in this order, and in another embodiment, the photomasks 403, 402, 401 may also be formed sequentially in the forming process.

Thus, according to the forming method of the present embodiment, the complex sidewall image transfer technique is still avoided, and a multiple photolithography and etching is mainly used to form a smaller, more densely packed layout or semiconductor under a cost-saving and simplified process flow. Moreover, the forming method of the present embodiment also uses the photomask 401, 402 to define the entity patterns 401*b*, 402*b* extended along the same direction, within another region, so that, the openings 194, 294 parallel and alternately extended along the same direction are also formed through a double patterning process in the another region, during the openings 192, 292 are formed. That is, the number of the photomask used in the present invention can be sufficient reduced.

Figure 19:
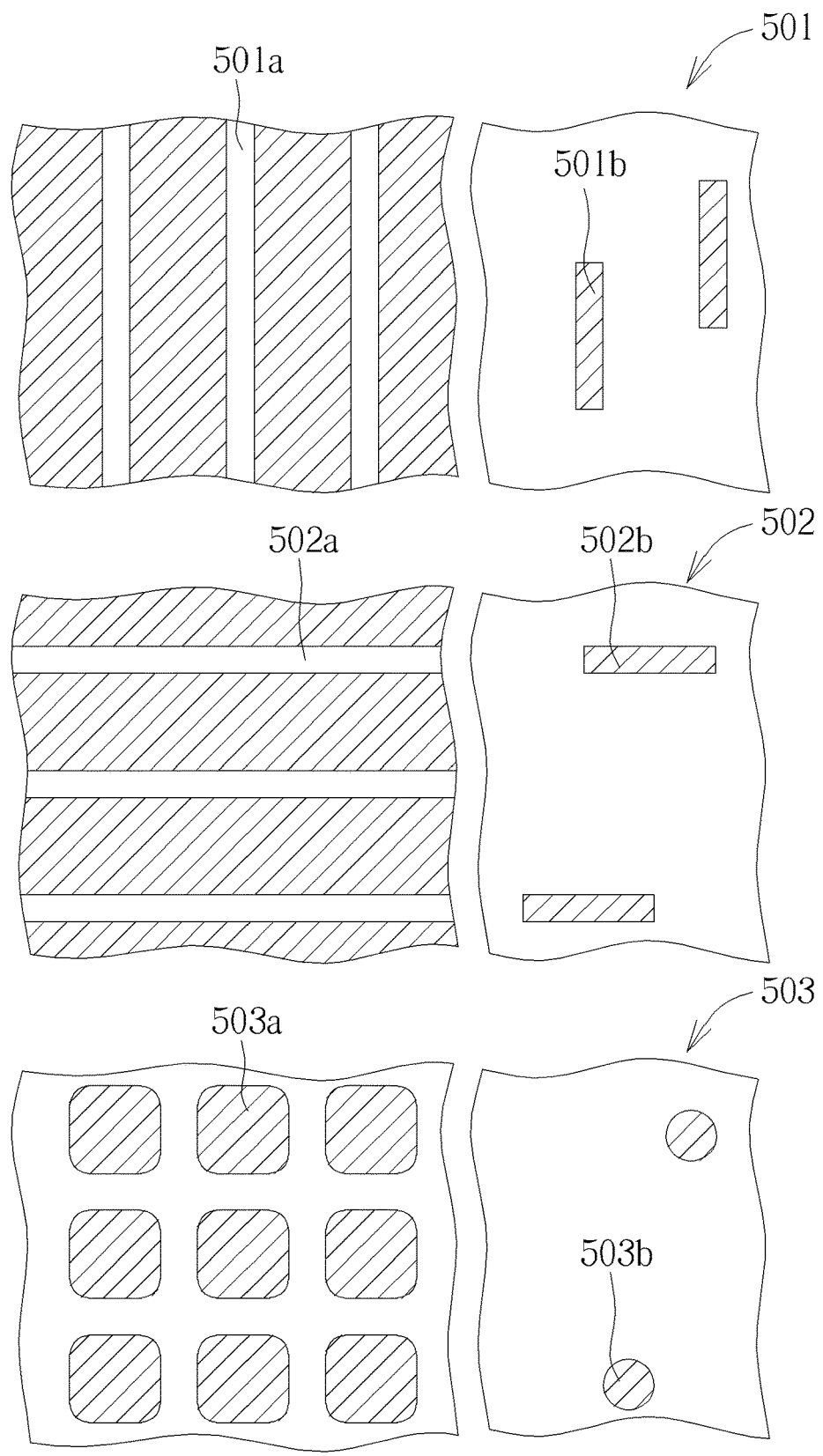
Figure 20:
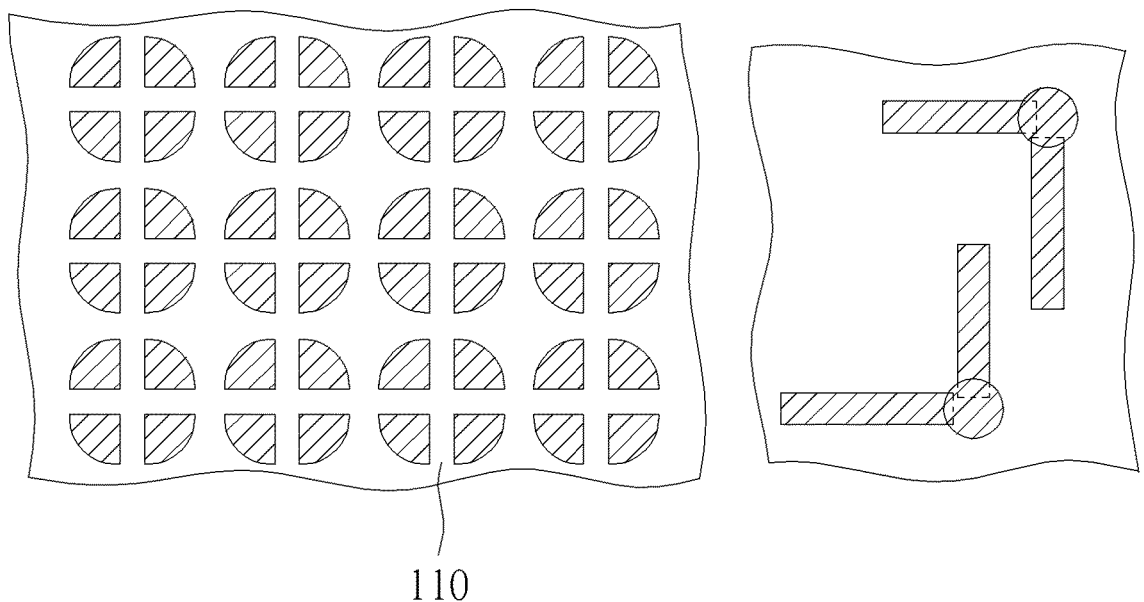

As shown in FIGS. 19 and 20, a schematic diagram is shown to illustrate a forming process of a semiconductor device according to the third embodiment of the present invention. The formal steps in the present embodiment are similar to those in the first or the second embodiment, and which will not redundantly described herein. The differences between the present embodiment and the aforementioned third embodiment are that, the forming method of the present embodiment is achieved by using three photomask 501, 502, 503 as shown in FIG. 19, with the photomask 501 defining a plurality of opening patterns 501a and blocking patterns 501b extended along a same direction, within two regions respectively, with the photomask 502 defining a plurality of opening patterns 502a and the blocking patterns 502b extended along another direction, within the two regions respectively, and with the photomask 503 defining a plurality of blocking patterns 503a, 503b, within the two regions respectively. It is noted that, the blocking patterns 501b, 502b formed within the same region are not overlapped with each other, and each of the blocking patterns 501b, 502b are partially overlapped with each of the blocking patterns 503b, as shown in FIG. 20.

Accordingly to those three photomask 501, 502, 503, corresponding openings and blocking patterns are respectively formed in various photoresist structures sequentially formed on the hard mask layer 130 and/or the target layer 110. Thus, while simultaneously transferring the corresponding openings and the blocking patterns to the hard mask layer 130 and/or the target layer 110 underneath, mask patterns (not shown in the drawings) and/or the target patterns (not shown in the drawings) with relative smaller dimension and pitch are therefore formed in one region. Furthermore, in another region, corresponding patterns which in connect with each other are formed accordingly. That is, the forming method of the present embodiment is able to formed finer structure under reduced number of the photomask and simplified process flow.

Figure 21:
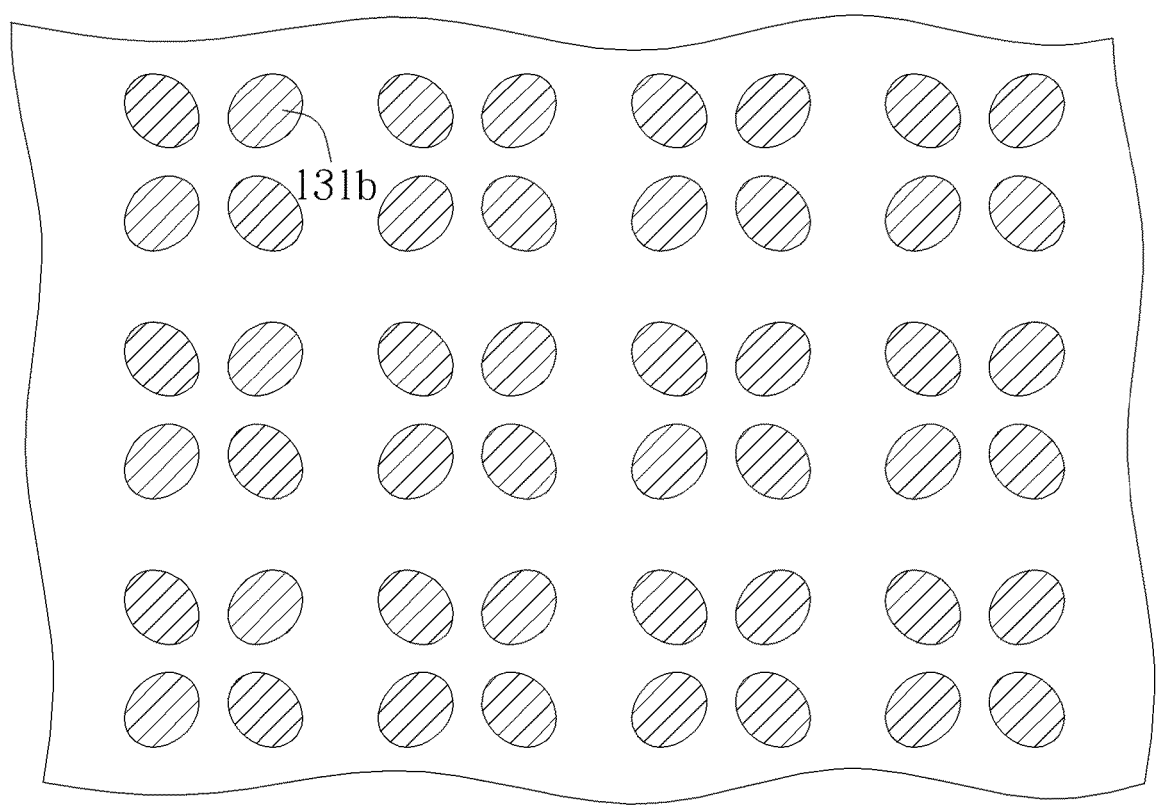
FIG. 21 is a schematic diagram illustrating a method of forming a semiconductor device according to a fourth embodiment of the present invention.

As shown in FIG. 21, a schematic diagram is shown to illustrate a forming process of a semiconductor device according to the fourth embodiment of the present invention. The formal steps in the present embodiment are similar to those in the aforementioned embodiments, and which will not redundantly described herein. The differences between the present embodiment and the aforementioned embodiments are that, the forming method of the present embodiment further includes a trimming process after forming the mask patterns 131 and/or the material patterns 111. For example, an isotropic etching is performed, to laterally etch the mask patterns 131 and/or the material patterns 111, to further adjust the dimension or the shape of the mask patterns 131 and/or the material patterns 111. That is, mask patterns 131b and/or material patterns (not shown in the drawings) having a relative smaller dimension or a different shape are obtained, as shown in FIG. 21.

Overall speaking, the method of the present invention includes sequentially forming virtuous photoresist structures on a material layer such as a hard mask layer and/or a target layer, with each of the photoresist structures defining openings extended along different directions and blocking patterns overlapped with those openings, respectively. Since the formed openings cross with each other, and the crossed portion (namely, the overlapped portion) thereof further overlap with the blocking patterns, the corresponding patterns of the blocking patterns may be further patterned by the corresponding openings of these openings, during transferring those openings and the blocking patterns to the material layer. In this way, plural patterns, such as the hard mask pattern and or the material patterns, with smaller pitch and dimension related to the blocking patterns are therefore formed in the material layer. Thus, the forming method of the present invention is able to be used in general semiconductor process to form a smaller, more densely packed layout or semiconductor structure. Furthermore, the forming method may also perform a double patterning process, to form other openings which are alternately and parallel arranged in another region, during forming those openings, so as to reduce the number of the photomask used in the forming process.

In additional, people skilled in the arts may fully understand that although the processes of the aforementioned embodiments are all exemplified by forming the cross-type overlapped region, and the present invention is not limited to be achieved thereto. In some embodiments, the overlapped region between those openings and the blocking patterns may be further adjusted according to the requirement of the practical products. For example, in one embodiment, a double cross-type overlapped region or a triple cross-type overlapped region (not shown in the drawings) may also be formed, for forming further smaller, more densely packed layout or semiconductor under a cost-saving and simplified process flow.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   forming a material layer on a substrate;
   forming a first photoresist layer on the material layer through a first photomask, the first photoresist layer comprising a plurality of first openings paralleled extended along a first direction;
   forming a second photoresist layer on the material layer through a second photomask, the second photoresist layer comprising a plurality of second openings paralleled extended along a second direction, the second openings of the second photoresist layer across the first openings of the first photoresist layer to form a plurality of overlapped regions;
   forming a third photoresist layer on the material layer through a third photomask, the third photoresist layer comprising a plurality of first patterns arranged in an array arrangement, each of the first patterns overlapped each of the overlapped regions; and
   transferring the first openings of the first photoresist layer, the second openings of the second photoresist layer and the first patterns of the third photoresist layer to the material layer, to from a plurality of material patterns in an array arrangement.

2. The method of forming a semiconductor device according to claim 1, wherein the second openings of the second photoresist layer are perpendicular to the first openings of the first photoresist layer.

3. The method of forming a semiconductor device according to claim 1, wherein the third photoresist layer, the second photoresist layer and the first photoresist layer are sequentially formed on the material layer.

4. The method of forming a semiconductor device according to claim 1, wherein the first photoresist layer, the second photoresist layer and the third photoresist layer are sequentially formed on the material layer.

5. The method of forming a semiconductor device according to claim 1, wherein further comprising:
   performing a trimming process to etch each of the material patterns.

6. The method of forming a semiconductor device according to claim 1, wherein the substrate comprises a first region and a second region, the first openings, the second openings and the first patterns are formed in the first region, and the method further comprises:

forming the first photoresist layer, the first photoresist layer further comprising a plurality of third openings paralleled extended along the first direction, in the second region;

forming the second photoresist layer, the second photoresist layer further comprising a plurality of fourth openings paralleled extended along the first direction, in the second region, and the fourth openings of the second photoresist layer and the third openings of the first photoresist layer being not overlapped with each other.

7. The method of forming a semiconductor device according to claim 6, further comprising:

forming the third photoresist layer covered the entire second region.

8. The method of forming a semiconductor device according to claim 1, wherein the substrate comprises a first region and a second region, the first openings, the second openings and the first patterns are formed in the first region, and the method further comprises:

forming the first photoresist layer, the first photoresist layer further comprising a plurality of second patterns paralleled extended along the first direction, in the second region;

forming the second photoresist layer, the second photoresist layer further comprising a plurality of third patterns paralleled extended along the second direction, in the second region, and the third patterns of the second photoresist layer and the second patterns of the first photoresist layer being not overlapped with each other.

9. The method of forming a semiconductor device according to claim 8, further comprising:

forming the third photoresist layer, the third photoresist layer further comprising a plurality of fourth patterns in the second region, each of the fourth patterns partially overlapped each of the third patterns of the second photoresist layer and each of the second patterns of the first photoresist layer, respectively.

10. The method of forming a semiconductor device according to claim 1, wherein the material layer comprises a hard mask layer.

11. The method of forming a semiconductor device according to claim 10, further comprising:

forming a dielectric layer on the substrate;

forming a plurality of plugs in the dielectric layer;

forming a conductive layer on the dielectric layer and the plugs; and patterning the conductive layer by using the material patterns as a mask.

12. The method of forming a semiconductor device according to claim 1, wherein the material layer comprises a conductive layer.

13. The method of forming a semiconductor device according to claim 12, further comprising:

forming a dielectric layer on the substrate; and forming a plurality of plugs in the dielectric layer, wherein the conductive layer is formed on the plugs and the dielectric layer.

14. A method of forming a semiconductor device, comprising:

forming a material layer on a substrate;

forming a first photoresist layer on the material layer through a first photomask, the first photoresist layer comprising a plurality of first patterns paralleled extended along a first direction;

forming a second photoresist layer on the material layer through a second photomask, the second photoresist layer comprising a plurality of second patterns paralleled extended along a second direction, the second patterns of the second photoresist layer across the first patterns of the first photoresist layer to form a plurality of overlapped regions;

forming a third photoresist layer on the material layer through a third photomask, the third photoresist layer comprising a plurality of openings arranged in an array arrangement, and each of the openings overlapped each of the overlapped regions; and transferring the first patterns of the first photoresist layer, the second patterns of the second photoresist layer and the openings of the third photoresist layer to the material layer, to from a plurality material patterns in an array arrangement.

15. The method of forming a semiconductor device according to claim 14, wherein the substrate comprises a first region and a second region, the first patterns, the second patterns and the openings are formed in the first region, and the method further comprises:

forming the first photoresist layer, the first photoresist layer further comprising a plurality of third patterns in the second region;

forming the second photoresist layer, the second photoresist layer further comprising a plurality of fourth patterns in the second region, and the fourth patterns of the second photoresist layer and the third patterns of the first photoresist layer being not overlapped with each other.

16. The method of forming a semiconductor device according to claim 15, further comprising:

forming the third photoresist layer, the third photoresist layer further comprising a plurality of fifth patterns in the second region, and each of the fifth patterns partially overlapped each of the fourth patterns of the second photoresist layer and each of the third patterns of the first photoresist layer, respectively.

17. The method of forming a semiconductor device according to claim 14, wherein the material layer comprises a hard mask layer.

18. The method of forming a semiconductor device according to claim 17, further comprising:

forming a dielectric layer on the substrate;

forming a plurality of plugs in the dielectric layer;

forming a conductive layer on the dielectric layer and the plugs; and patterning the conductive layer by using the material patterns as a mask.

19. The method of forming a semiconductor device according to claim 14, wherein the material layer comprises a conductive layer.

20. The method of forming a semiconductor device according to claim 19, further comprising:

forming a dielectric layer on the substrate; and forming a plurality of plugs in the dielectric layer, wherein the conductive layer is formed on the plugs and the dielectric layer.

* * * * *